United States Patent [19]

Kubota et al.

[11] Patent Number: 4,492,955
[45] Date of Patent: Jan. 8, 1985

[54] BATTERY VOLTAGE DROP ALARM DEVICE FOR A BATTERY FORKLIFT TRUCK

[75] Inventors: Toru Kubota, Koganei; Masazi Tamate, Musashino; Masaaki Sauzu, Fuchu, all of Japan

[73] Assignee: Nissan Motor Company, Limited, Yokohama, Japan

[21] Appl. No.: 476,717

[22] Filed: Mar. 18, 1983

[30] Foreign Application Priority Data

Mar. 26, 1982 [JP] Japan .................. 57-47259

[51] Int. Cl.³ .................. G08B 21/00; G01R 31/36; H02J 7/00
[52] U.S. Cl. .................. 340/636; 320/40; 320/48
[58] Field of Search .......... 340/636; 320/13, 48, 320/40; 324/433

[56] References Cited

U.S. PATENT DOCUMENTS

| | | | |
|---|---|---|---|
| 3,475,061 | 10/1969 | Steinkamp et al. | 340/636 X |
| 3,522,481 | 8/1970 | Terzic | 340/636 X |
| 3,568,175 | 3/1971 | Schwein et al. | 340/636 X |
| 3,576,488 | 4/1971 | Zug et al. | 340/636 X |
| 3,852,732 | 12/1974 | Yorksie et al. | 340/636 X |
| 3,934,188 | 1/1976 | York | 340/636 X |
| 3,997,888 | 12/1976 | Kremer | 340/636 |
| 4,258,306 | 3/1981 | Bourke et al. | 340/636 X |

Primary Examiner—James L. Rowland
Assistant Examiner—Daniel Myer
Attorney, Agent, or Firm—Schwartz, Jeffery, Schwaab, Mack, Blumenthal & Koch

[57] ABSTRACT

A battery voltage drop alarm circuit comprises a battery voltage drop detecting circuit, an alarm circuit, and an alarm cut off circuit. The battery voltage drop detecting circuit outputs an alarm instruction signal to the alarm circuit when the battery voltage drops to less than a predetermined value, then the alarm circuit generates an alarm sound. The alarm cut off circuit generates an alarm operation cut off signal to the alarm circuit to cut off the alarm operation thereof when the battery forklift performs the auxiliary work.

9 Claims, 1 Drawing Figure

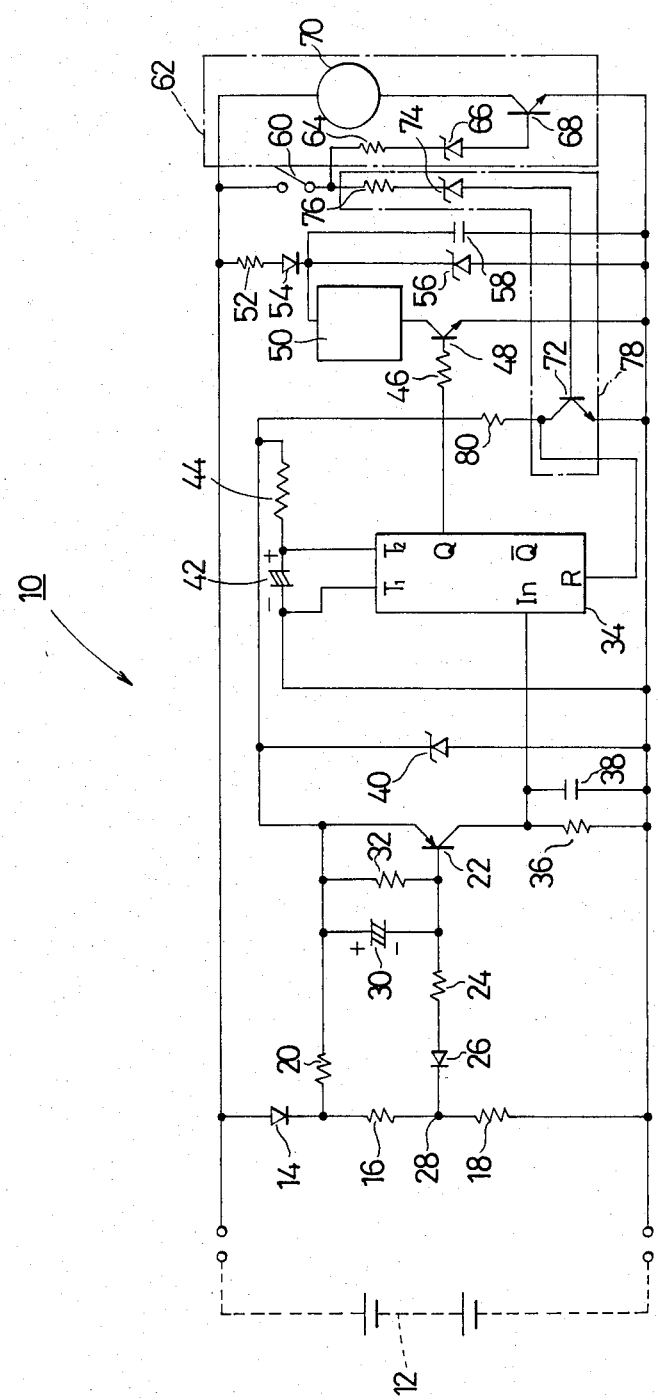

BATTERY VOLTAGE DROP ALARM DEVICE FOR A BATTERY FORKLIFT TRUCK

BACKGROUND OF THE INVENTION

The present invention relates to an alarm device for a battery forklift truck, and more particularly to a battery voltage drop alarm device for suitably alarming that the battery voltage has dropped to less than a specified voltage.

In battery forklift trucks, it is necessary to inform an operator of the truck that the battery should be charged when the battery voltage has dropped to less than a prescribed value, since the insufficient battery voltage causes the normal operation of the forklift truck to be failed.

In conventional battery voltage drop alarm devices, the battery voltage drop is always detected and is indicated by a voltmeter, so that the operator observes the voltage value thereof to determine whether battery charge is required or not, thereby to prevent the overdischarge of the battery.

However, in general, the voltage drop of the battery in the auxiliary operation of the forklift truck very largely depends upon the kind of auxiliary work and weight of the load, so that it is essentially unstable as compared with that in propulsive operation of the battery forklift truck.

The term "auxiliary operation" is used herein to mean operation for moving a load relative to the body of the truck (for example, an operation for raising a fork carriage, an operation for tilting or traversing a mast or an operation for effecting rotational movement of a load) and in contrast to propulsive operation for moving the truck as a whole.

Consequently, in such battery voltage drop alarm devices as described above, in spite of the fact that the battery charge is actually sufficient, that is, the battery voltage is larger than the prescribed value, the operator may misjudge that it is necessary to charge the battery again at the time of auxiliary operation by observing the voltage drop on the voltmeter. Therefore, there is great possibility that although it is not necessary to charge the battery, the operator would have to stop the work in order to charge it; this causes the loss of time and decrease in work efficiency.

SUMMARY OF THE INVENTION

It is therefore an object of the present invention to provide a battery voltage drop alarm device which can prevent misjudgement of an operator by providing an alarm cut off means to cut off the alarm function when the operator of a battery forklift truck performs the auxiliary operation.

It is another object of the invention to provide a battery voltage drop alarm device which can prevent certainly the overdischarge of the battery by correctly alarming the battery voltage drop.

Briefly described, these and other objects of the invention are accomplished by the provision of a battery voltage drop alarm device comprising a battery voltage drop detecting circuit, an alarm circuit, and alarm cut off means. The battery voltage drop detecting circuit supplies an instruction signal to the alarm circuit when the battery voltage drops to less than a prescribed value, then the alarm circuit generates an alarm. The alarm cut off means is used to cut off the alarm operation of the alarm circuit when the operator conducts auxiliary work using the auxiliary movement apparatus of the battery forklift.

BRIEF DESCRIPTION OF THE DRAWING

These and other objects, features and advantages of the present invention will be more apparent from the following description of a preferred embodiment, taken in conjunction with the accompanying drawing, and in which the sole FIGURE is a schematic circuit diagram of the battery voltage drop alarm device for a battery forklift truck according to the present invention.

DETAILED DESCRIPTION OF THE PREFERRED EMBODIMENT

Referring to the drawing, there is shown an embodiment of the battery voltage drop alarm device of the present invention which is indicated by a reference numeral 10. This battery voltage drop alarm device 10 is connected to a battery 12. A first inverse current prevention diode 14, and resistors 16 and 18 are connected in series to the battery 12, thereby forming a loop. The diode 14 is connected at its output side to an emitter of a PNP transistor 22 through the resistor 20 connected in parallel to the resistor 16. The transistor 22 is connected at its base to the mid-point 28 between the resistors 16 and 18 through a resistor 24 and a second inverse current prevention diode 26. The emitter and base of the transistor 22 are connected through a capacitor 30 and a resistor 32 connected in parallel. The collector of the transistor 22 is connected to an input terminal In of a timer element 34 such as a Retriggerable Monostable Multivibrator with reset, and also to a common negative terminal of the battery 12 through a resistor 36 and a capacitor 38 connected in parallel.

With such an arrangement as described above, when the voltage of the battery 12 drops to less than a predetermined value, the voltage of the mid-point 28 drops to turn on the transistor 22, so that an alarm instruction signal, high level signal, is supplied from the collector of the transistor 22 to the input terminal In of the timer element 34.

A Zener diode 40 is connected across the emitter of the transistor 22 and the common negative terminal of the battery 12.

The function of the afore-mentioned timer element 34 is to output a pulse signal with a pulse width to be determined by values of a capacitor 42 and a resistor 44 each connected to the timing terminal T1 and T2 of the timer element 34, when the alarm instruction signal is inputted from the collector of the transistor 22. The resistor 44 is connected to the resistor 20 and the capacitor 42 is connected to the common negative terminal of the battery 12.

The timer element 34 is connected at its output terminal Q to the base of an NPN transistor 48 through a resistor 46. The transistor 48 is connected at its collector to a buzzer 50 and at its emitter to the common negative terminal of the battery 12. The buzzer 50 is connected to the common positive terminal of the battery 12 through a resistor 52 and a third inverse current prevention diode 54 connected in series. Therefore, when a pulse signal is outputted from the timer element 34, the transistor 48 is turned on only for the time corresponding to the pulse width of the timer element 34 and the electric power flows from the battery 12 to the buzzer 50 through the resistor 52 and the diode 54, so that the buzzer 50 generates an alarm sound only for the above-mentioned time.

The output terminal of the diode 54 is also connected to the common negative terminal of the battery 12 through a Zener diode 56 and a capacitor 58 connected in parallel.

The afore-mentioned battery 12 is provided with an auxiliary apparatus circuit 62 comprising a resistor 64, Zener diode 66, NPN transistor 68, and an auxiliary drive motor 70 through an auxiliary work switch 60.

The auxiliary drive motor 70 is connected to the common positive terminal of the battery 12 and also to the connector terminal of the transistor 68. The transistor 68 is connected at its emitter terminal to the common negative terminal of the battery 12. The auxiliary work switch 60 is connected to the positive terminal of the battery 12 and also to the base terminal of the transistor 68 through the resistor 64 and the Zener diode 66. When the switch 60 is set to "on", the transistor 68 is turned on to supply the electric power to the auxiliary drive motor 70, this enables the auxiliary operation. On the other hand, setting "off" the switch 60 maintain the transistor 68 off, so that the auxiliary work is not done.

Across the auxiliary work switch 60 and the timer element 34, an alarm cut off circuit 78 is provided, which comprises an NPN transistor 72, a Zener diode 74, and a resistor 76. The transistor 72 is connected at its collector terminal to the resistors 20 and 44 through a resistor 80 and also to a reset terminal R of the timer element 34. The base of the transistor 72 is connected to the auxiliary work switch 60 through the Zener diode 74 and the resistor 76, and the emitter thereof is connected to the common negative terminal of the battery 12. Therefore, when the auxiliary work switch 60 is set to "off", the transistor 72 is turned off; on the other hand, setting "on" the above switch 60 allows the transistor 72 to be turned on.

Referring to the FIGURE, the operation of this embodiment of the invention is now described hereinafter.

(1) In the case where the auxiliary work switch 60 is set to "off" and the auxiliary operation is not performed:

when the propulsive operation is executed and the voltage of the battery 12 drops to less than a predetermined level, the transistor 22 is turned on and an alarm instruciton signal is supplied to the timer element 34. At this time, since the auxiliary work switch 60 has been set to off, the transistor 72 is turned off, so that a high level signal is fed through the resistor 20 to the input terminal In of the timer element 34 to be made operative. Once the timer element 34 has been set into the operation mode, it outputs a signal at high level to the transistor 48 to turn on the transistor 48, this allows the buzzer 50 to generate an alarm sound.

(2) In the case where the auxiliary work switch 60 is set to "on" and the auxiliary operation is executed:

a high-level signal is supplied to the base terminal of the transistor 72 in an alarm cut off circuit 78 to turn on the transistor 72, so that in this state, a low level signal is supplied to the reset terminal R of the timer element 34.

The timer element 34 is then in the reset state. At this time, since the timer element 34 does not supply a high-level signal to the transistor 48 even if an alarm instruction signal is supplied to the timer element 34; therefore the transistor 48 is not turned on, the buzzer 50 doesn't generate an alarm sound.

As described above, according to the battery voltage drop alarm device for battery forklift truck of the present invention, it is possible to prevent the erroneous operation of the alarm device due to unstable load to be applied to the battery upon performing the auxiliary operation. In addition, a suitable and correct alarm sound to be generated using the alarm device of the invention permits the operator of the forklift truck to perform smooth and efficient forklift work without interruption due to erroneous alarms; this results in the reduction of loss time of the work.

With this detailed description of the specific circuit used to illustrate the preferred embodiment of the present invention and the operation thereof, it will be obvious to those skilled in the art that various modifications can be made in the present system and in the specific circuit configuration described herein without departing from the spirit and scope of the invention which is limited only by the appended claims.

What is claimed is:

1. In a battery forklift truck having an auxiliary movement apparatus, a battery voltage drop alarm device for alarming the necessity of charging a battery by detecting that the battery voltage drops to less than a prescribed value, comprising:
    (a) battery voltage drop detecting means for generating an alarm instruction signal by detecting that the voltage of said battery drops to less than a prescribed voltage value;
    (b) alarm means for generating an alarm signal according to the alarm instruction signal generated from said battery voltage drop detecting means; and
    (c) alarm cut off means connected to an auxiliary work switching means for supplying an electric power from the battery to the auxiliary movement apparatus and also connected to said alarm means, said alarm cut off means being provided for stopping the alarm operation of said alarm means when the auxiliary work switching means supplies the electric power to the auxiliary movement apparatus.

2. The battery voltage drop alarm device according to claim 1, wherein said alarm means is connected to said battery voltage drop detecting means and comprises a timer means connected to said alarm cut off means, and an alarm signal generating means connected to the timer means, the timer means supplying an output signal to the alarm signal generating means when the alarm instruction signal is supplied from said battery voltage drop detecting means, while the timer means does not supply any signal when an alarm operation cut off signal is supplied from said alarm cut off means even if the alarm instruction signal is supplied from said battery voltage drop detecting means, the alarm signal generating means generating an alarm sound for a predetermined time period in accordance with the predetermined time period output signal generated from the timer means.

3. The battery voltage drop alarm device according to claim 2, wherein said alarm cut off means includes a first transistor so that the alarm operation cut off signal can flow to said alarm means.

4. The battery voltage drop alarm device according to claim 3, wherein the timer means comprises a timer element, and a capacitor and a resistor which determine the time period of the timer element, the alarm signal generating means including a second transistor and a buzzer which is connected to the battery through the second transistor, the second transistor being connected to the output terminal of the timer element and turned on by an output signal from the timer element so that the buzzer sounds.

5. The battery voltage drop alarm device according to claim 4, wherein said alarm cut off means further includes a Zener diode and a resistor connected in series to the base of the first transistor.

6. The battery voltage drop alarm device according to claim 5, wherein said voltage drop detecting means comprises a voltage drop detecting circuit for detecting the voltage drop of the battery and an alarm instruction circuit for generating an alarm instruction signal in accordance with the detected voltage value.

7. The battery voltage drop alarm device according to claim 6, wherein the voltage drop detecting circuit includes a diode and two resistors connected in the series to the battery, the alarm instruction means including a third transistor having an emitter connected to the output side of the diode and a base connected to the mid-point of the two resistors and a collector connected to the input terminal of the timer element, when the voltage of the battery drops to less than a predetermined value, the voltage at the mid-point of the two resistors drops and the base voltage of the third transistor also drops to turn on the third transistor, whereby the electric power is supplied from the battery through the third transistor to the input terminal of said timer element.

8. The battery voltage drop alarm device according to claim 7, wherein said timer element comprises a Retriggerable Monostable Multivibrator with reset.

9. A battery voltage drop alarm device for a battery forklift truck, comprising:
 (a) a voltage drop detecting circuit for detecting the voltage drop of the battery;
 (b) an alarm instruction circuit for generating an alarm instruction signal when the detected voltage is less than a predetermined level;
 (c) a timer circuit which supplies an output signal for a predetermined time period when the alarm instruction signal is supplied from said alarm instruction circuit;
 (d) an alarm generating circuit for generating an alarm sound for a predetermined time period when the output signal is supplied from said timer circuit;
 (e) an auxiliary work switching circuit for supplying an electric power from the battery to an auxiliary movement apparatus circuit; and
 (f) an alarm cut off circuit connected to said auxiliary work switching circuit and also to said timer circuit and for resetting said timer circuit when said auxiliary work switching circuit supplies the electric power to the auxiliary movement apparatus circuit, whereby the output signal is not supplied to said alarm generating circuit.

* * * * *